United States Patent [19]

Runaldue

[11] Patent Number: 5,067,110
[45] Date of Patent: Nov. 19, 1991

[54] GLOBAL RESET AND ZERO DETECTION FOR A MEMORY SYSTEM

[75] Inventor: Thomas J. Runaldue, San Jose, Calif.

[73] Assignee: Advanced Micro Devices, Inc., Sunnyvale, Calif.

[21] Appl. No.: 418,680

[22] Filed: Oct. 10, 1989

[51] Int. Cl.⁵ .............................................. G11C 11/40
[52] U.S. Cl. .................................. 365/189.07; 365/201
[58] Field of Search ................... 365/189.07, 201, 218

[56] References Cited

U.S. PATENT DOCUMENTS 4,321,695  3/1982  Redwine et al. ............... 365/189.07

Primary Examiner—Joseph A. Popek
Attorney, Agent, or Firm—Patrick, T. King

[57] ABSTRACT

A tag bit is provided for each row of a memory array. The tag bit is zero is all of the bits in a row are zeros. A detector scans input data to test for all zeros and the tag bit is reset to zero. The output signals for a row are forced to zero when the tag bit for that row is zero.

4 Claims, 5 Drawing Sheets

GLOBAL RESET AND ZERO DETECTION FOR A MEMORY SYSTEM

BACKGROUND OF THE INVENTION

1. Field of the Invention

This invention relates to memory systems and, more particularly, to systems for globally resetting the state of the memory cells in a memory system or subsystem to zero and to systems for detecting that all of the contents of a memory system or subsystems are in the zero state.

2. Prior Art

A memory device refers to a circuit which is used to store and retrieve information in binary, or digital, form. A memory system is a collection of memory devices. The devices are often arranged as an array of memory devices, or memory core elements, to form a memory array. A global reset for a memory system is defined as a condition in which every memory element is reset to a predefined logical zero state. A zero detection function is defined as a function which determines if every element in the memory array is in the reset state, or the logical zero state. A zero detection function is true if every memory element is in the reset state. A non-zero detection function is defined as follows: if one or more memory elements in a memory array are in a set state.

Often times, memory systems do not provide a global reset function. In addition many systems do not provide a test function to determine if the entire memory array is reset to zero state. Those memory systems which do implement a global reset function usually do so by using sequential write operations to write in zero values to all of the memory cells. Consequently, the minimum time required for the global reset function to be accomplished is the product of the number of memory addresses times the minimum write cycle for each cell. This type of memory reset function requires some form of control circuitry external to the memory to increment the memory addresses and write a zero into each memory cell.

Systems for determining other cells of a memory system are reset are required to sequentially read each memory cell and to determine if each memory cell is at a zero state. If one or more memory cells are in the non-zero state, then the all-zeros state function is false. The time required to test for all zeros in the memory cells varies, dependent upon whether the function for determining whether non-zeros are present and satisfied. The maximum time required to test for all zeros is the product of the number of memory addresses times the minimum read cycle time for the memory array.

The various techniques discussed for global reset and testing for zero states requires multiple read/write cycles for a memory.

SUMMARY OF THE INVENTION

It is an object of the invention to provide a memory system having a global reset function and a zero detect function.

In accordance with this and other objects of the invention, a memory system having a global reset capability is provided. The memory system includes a memory array having an array of memory cells arranged in rows and columns. A tag bit storage means, such as a tag column, is provided which has one tag-memory cell associated with each row of the memory cells in the array. The tag-memory cells will have a particular state indicative of all of the memory cells of an associated row being in a particular state. For example, that particular state is the zero state in some embodiments of the invention. Another state, such as the one state, is indicative that at least one of the memory cells of a row associated with a particular tag bit cell has a non-zero state. A zero detect logic is provided for detecting that all of the input data signals to a row of memory cells are all zeros. An output signal is provided indicating that an all zero input is going to the row of memory cells. The tag-memory cells are resetable to a zero state to indicate that the associated row of the memory array is to be treated as all being in the zero state. This is to be done even though the actual contents of the memory are not all zeros.

Circuits are provided for forcing the data output signals corresponding to the particular contents of a row of a memory array to zero states when the tag-memory cell associated with that particular row is at a zero state. A detector for detecting that the tag-memory cell is at a zero state is also provided. Bi-directional driver means are provided which are connected to the output of the memory array for sending and for receiving data information to and from the memory array.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A memory system is disclosed which has a global reset function and which has a zero detection function as provided by an extra tag bit for each row of a memory array. The tag bits are arranged in configuration referred to as a tag-column memory architecture, or configuration.

Figure 1:
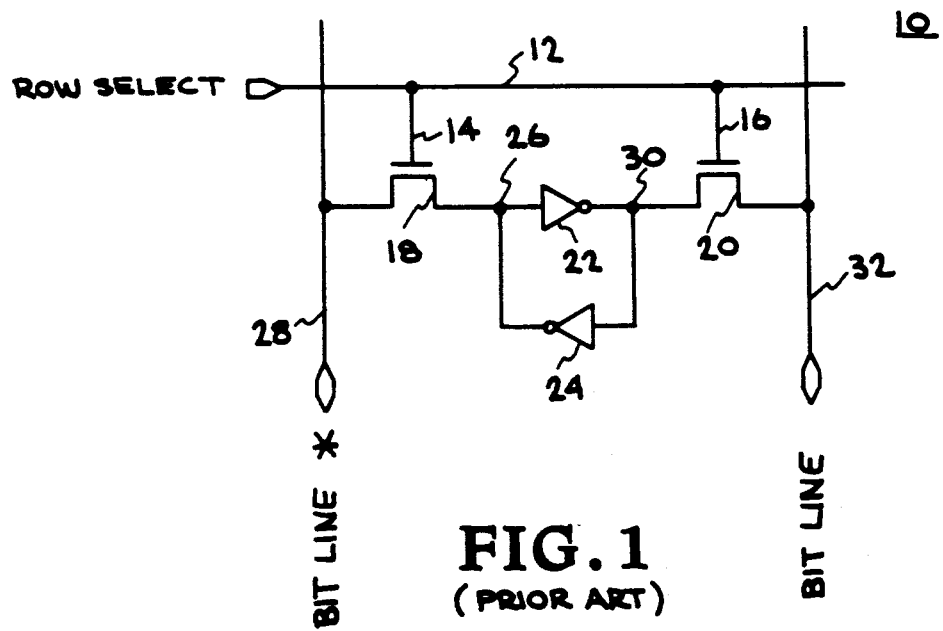
FIG. 1 is a schematic circuit diagram of a conventional static memory cell

FIG. 1 shows a conventional six-transistor CMOS memory element 10 a row select line 12 is connected to, respectively, to the gate terminals 14,16 of a first inverted bit line gate transistor 18 and a second bit line gate transistor 20. The storage element for the memory cell 10 is a pair of CMOS inverters 22,24, with the output terminal of the inverter 22 connected to the input terminal of the inverter 24 and with the output terminal of the inverter 24 connected to the input terminal of the inverter 22, as shown. An inverted output terminal 26 is coupled through the gate transistor 18 to an inverted bit line 28. A non-inverted output signal terminal 30 is coupled through the gate transistor 20 to a non-inverted bit line 32.

Figure 2:
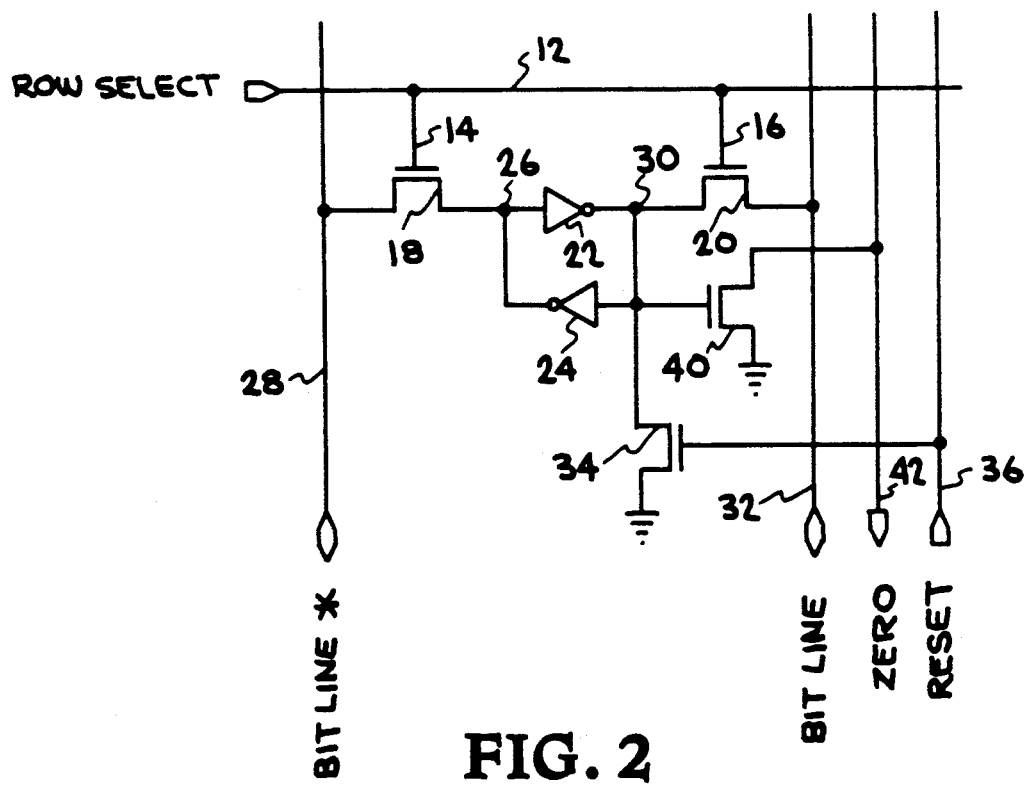
FIG. 2 is a schematic circuit diagram of a conventional static memory cell with additional active elements added to provide reset and zero-detection functions.

FIG. 2 shows the memory cell 10 of FIG. 1 with an N-channel transistor 34 added between the non-inverting terminal 30 and ground potential to provide a reset function of the non-inverting terminal to a zero state when a positive voltage is placed on the input terminal of the transistor 34 on a signal line 36. The state of the non-inverting terminal 30 of the memory cell is made available to a ZERO line through a transistor amplifier 40 which has its gate terminal connected to the non-inverting output terminal 30. The drain of the transistor 40 is coupled to the ground potential and a source of the transistor 40 is connected to a ZERO sense line 42. When the memory cell has a non-inverting terminal 30 voltage at a zero, or low, state, the ZERO line 42 has a high state. The bit line 32, the ZERO line 42 and the reset line 36 are also coupled to cells in different rows of the memory array, all the cells being in the same column. Thus the ZERO line 42 may be pulled to a low value, indicating that one of the memory cells in a column is at a high output state. Thus, the signal on the ZERO line 42 provides a signal indicating that all of the cells in a column have the zero state when the line 42 is at a high state.

Figure 3:
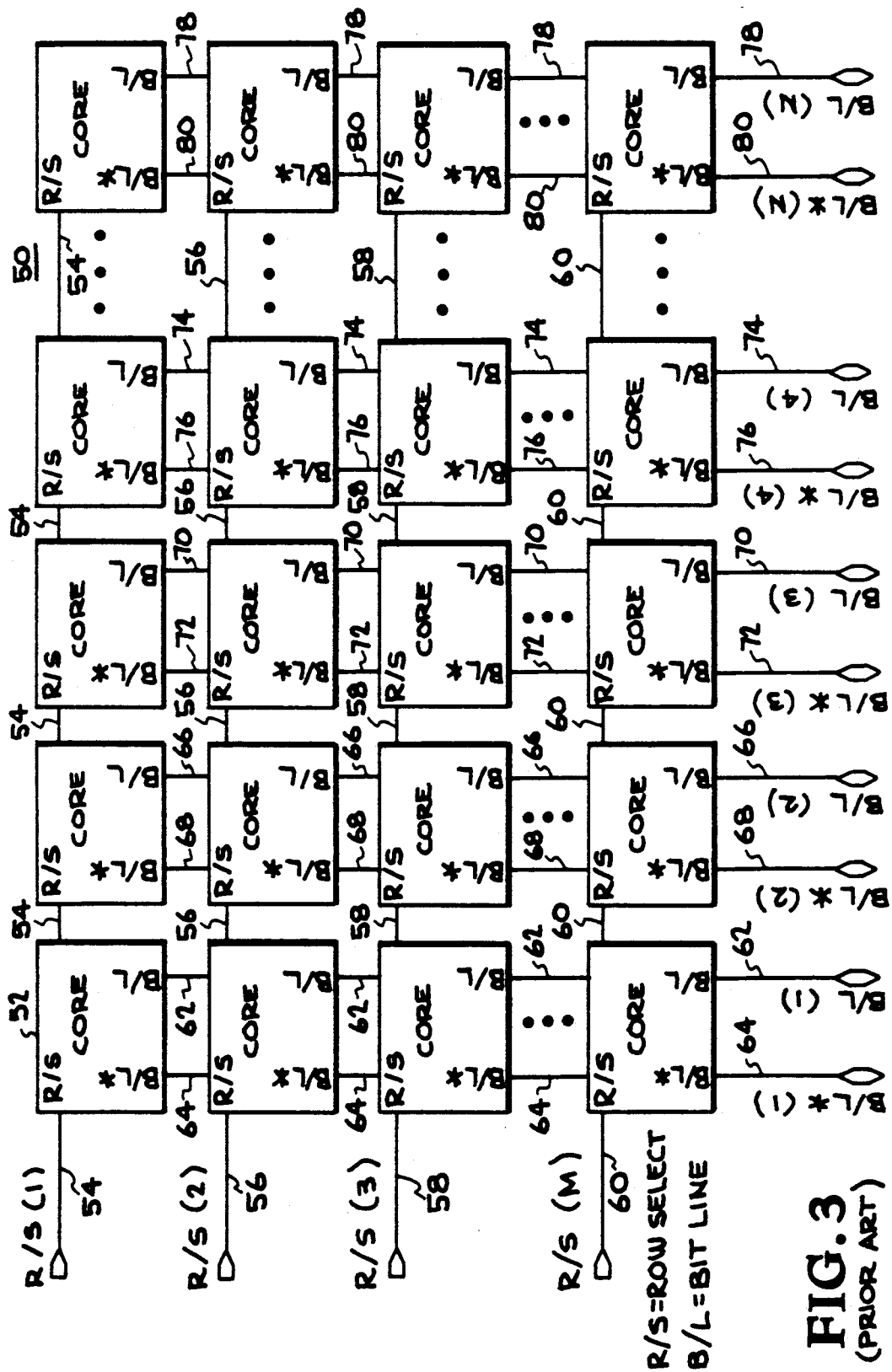
FIG. 3 is block diagram of a standard row and column array of memory cells including row select lines and pair of complementary bit lines for each column.

FIG. 3 shows a standard memory array 50 of memory cells, typically shown as 52 arranged in M rows as indicated in the drawing. Each row of the memory array contains N cells. Each row contains a row select line, typically shown for the first row as 54 which row select line is common to all of the memory elements of the first row. Similarly, the second row of memory elements has a row select line 56 associated with all of the memory elements. The third row of memory elements has a row select line 58 connected to all of the memory elements. Finally, the NTH row has a row select line 60 connected to all of the memory elements thereof.

Figure 4:
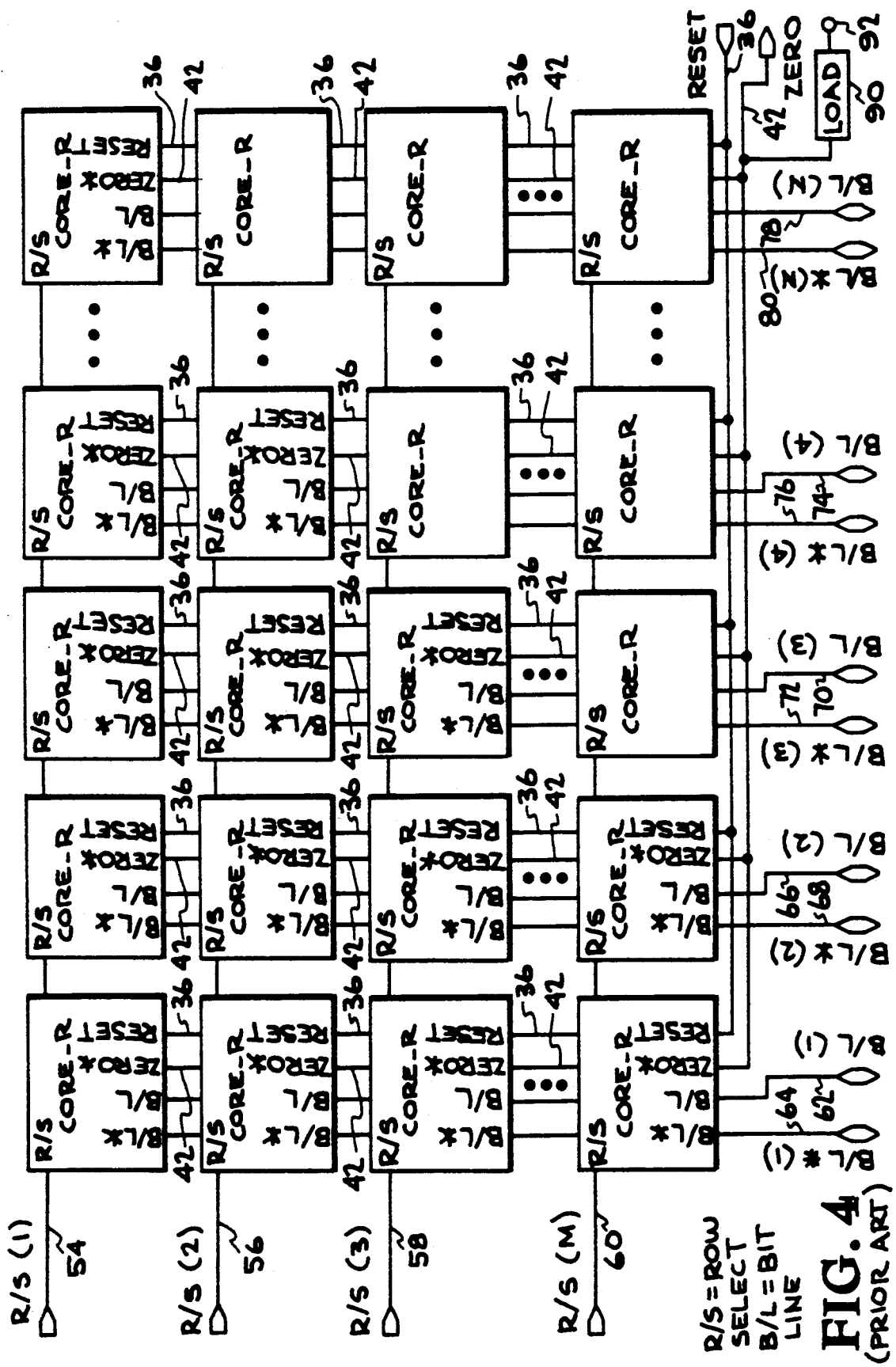
FIG. 4 is a block diagram of a standard array of memory cells with reset and zero detection functions implemented in a conventional manner.

The elements of the memory array rows are arranged in columns, as indicated in the drawing of FIG. 3. All of the bit lines of a column are common lines. For example for the first column of memory elements, including the memory element 52, a non-inverted bit line 62 and an inverted bit line 64 are commonly connected to all of the elements in the first column. Similar connections are provided for the second, third, fourth, and NTH columns as indicated by the respective non-verted and inverted bit line pairs 66,68; 70,72; 74,76; and 78,80. FIG. 4 shows the memory array of FIG. 3 with the addition of the reset line 36 which is connected to all of the row elements and column elements of the array. In addition, the ZERO detect line 42 is also connected to all of the cells which has a load impedance 90 connected thereto and to a positive voltage terminal 92, as shown. By connecting all of the reset lines 36 and the ZERO lines 42, respectively, together a global reset global and a global zero detection function are each implemented for an entire memory array. However, this implementation requires that the entire memory array contain the expanded memory core cells as shown in FIG. 2, along with the extra interconnection lines. The added interconnection lines for each cell in the larger memory array increases the area of a cell in its inner connections by an estimated 50% over a standard memory array such as shown in FIG. 1.

Figure 5:
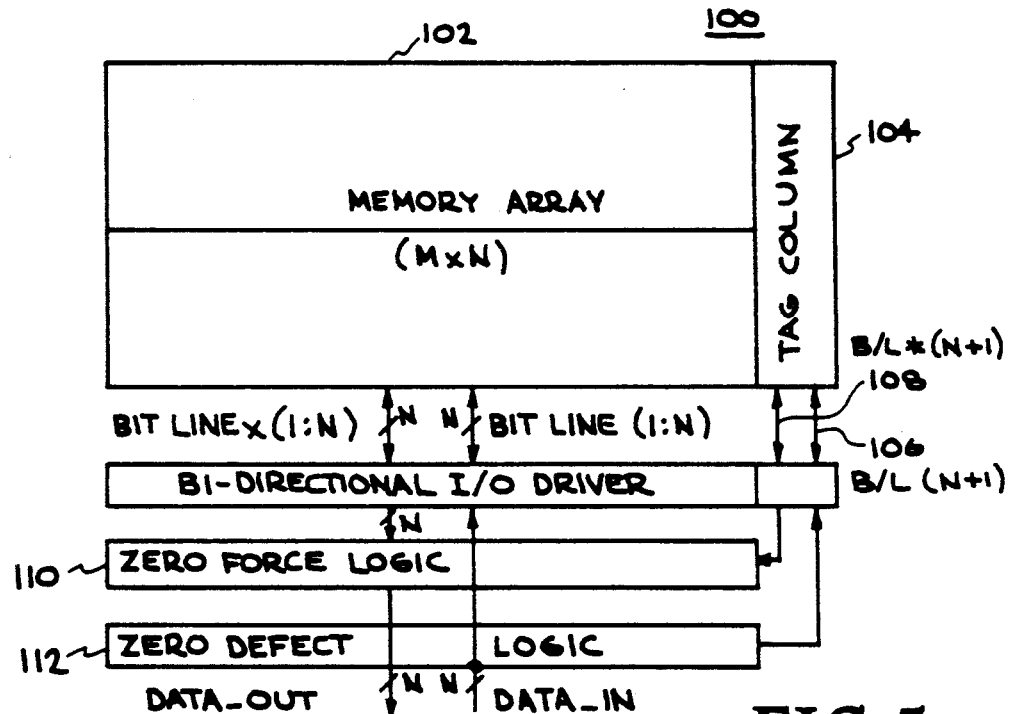
FIG. 5 is a block diagram of a row and column array of memory cells with one additional tag bit for each memory row to implement reset and zero detection functions according to the invention.

FIG. 5 shows an arrangement according to the invention for a memory system 100 which includes a global reset function and a zero detection function. The system includes a memory array 102 which is similar to that shown in FIG. 3. These functions are accomplished by using an additional tag column 104 which contains an additional tag bit, one for each memory row.

Figure 6:
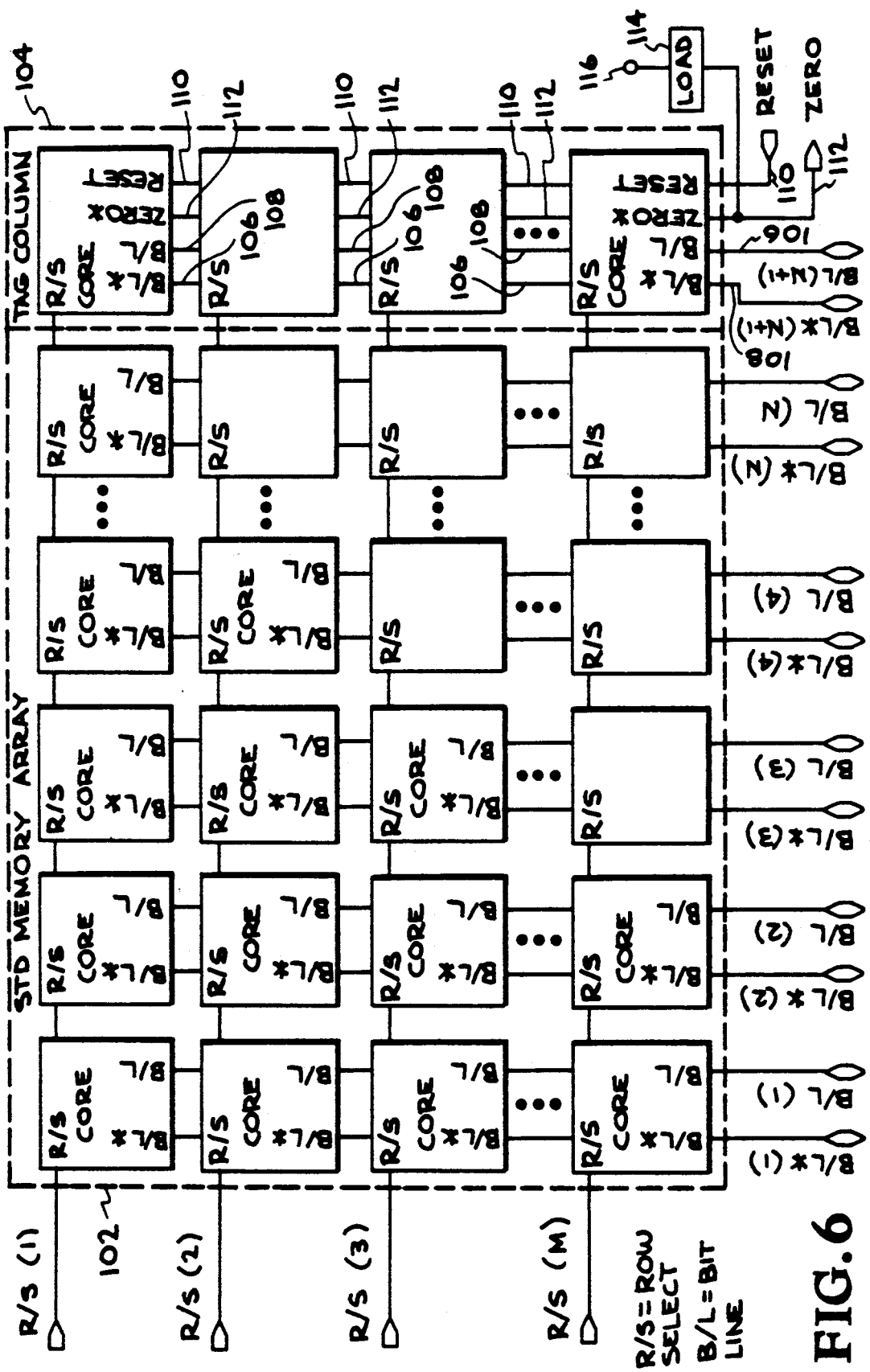
FIG. 6 is a block diagram which illustrates a system according to the invention for obtaining global reset and zero detection functions.

FIG. 6 shows the standard memory array 102 as indicated having row select lines 1 through M and bit line pairs 1 through N. The tag column 104 includes bit line pairs N+1 106, 108 which are commonly connected to all of the memory core elements of the tag column 104 as shown. In addition a reset line 110 and a ZERO line 112 is connected to all of the core elements of the tag column 104 as shown. A load impedance 114 is connected to line 112 which is connected to a positive reference voltage 116. It is evident from FIG. 5 that the use of the tag bit for each of the rows increases the size of an array by a marginal amount. Use of the more dense standard memory array and the one extra memory set for each row with the reset zero detection circuitry maintains the size of the array at almost the same size as the standard memory array without the global reset and zero detection functions.

Returning to FIG. 5, the memory system 100 requires additional logic, including the zero force logic 110 and the zero detect logic 112 which are each located at the I/0 core of the memory system.

Figure 7:
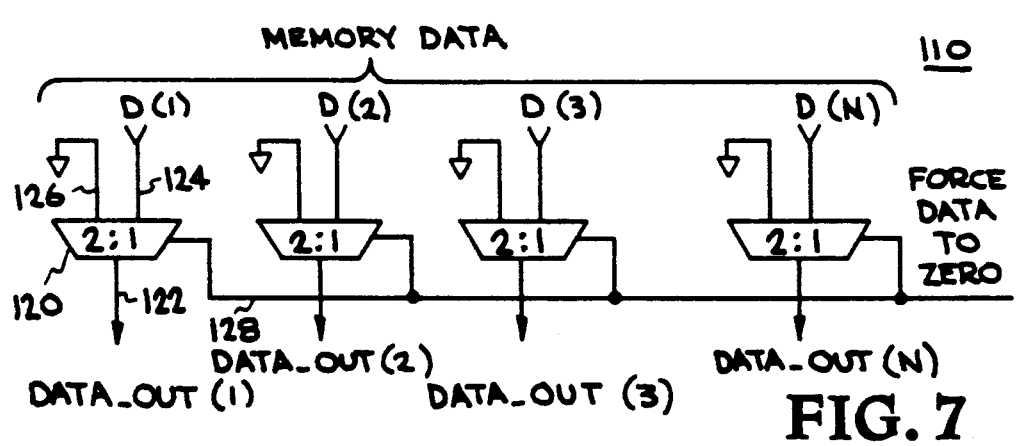
FIG. 7 is a schematic circuit diagram of a logic circuit for forcing output data from a memory system to predetermined state values, such as zero states.

FIG. 7 shows the zero force logic 110. This logic circuit includes a two-to-one multiplexer for each of the data output bits. Data output line 1 is a typical representation. A multiplexer 120 has an output line 122 for providing the output data. One of the input lines 124 is connected to the output line for the first bit of an output word. The other input line 126 to the input multiplexer is connected to the reference ground potential. Note that the input line 126 may also be connected to a high reference potential to, alternatively, provide a high input level to the multiplexer. The multiplexer is controlled by a signal line 128 which forces the output data on line 122 to a zero, or other predetermined, level. Similarly, the other data output lines 2 through N have multiplexers and connections similar to that for the multiplexer 122.

Figure 8:
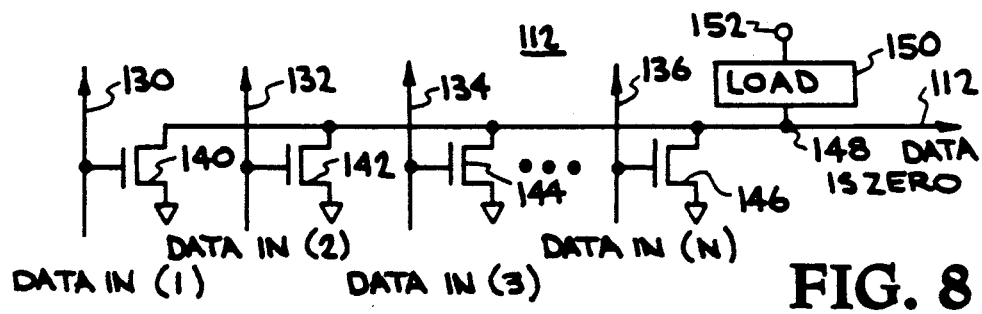
FIG. 8 is a schematic circuitt diagram of a logic circuit for detecting whether input data bits are zeroes.

FIG. 8 shows a circuit configuration for the zero detect logic 112. Each of the data input lines 130, 132, 134, 136 for the data input lines 1 through N are respectively connected to the gates of transistors 140, 142, 144, 146, all of which have their drains connected to the ground reference potential. All of the drains of those transistors are connected together to a node 148 which has a load impedance 150 connected thereto and to a positive reference voltage terminal 152. The node 148 is connected to the zero line 112. When any of the data lines 130, 132, 134, 136 is at a high state, the corresponding associated transistor 140, 142, 144, 146 is turned on to pull the node towards the ground reference potential. This results in the zero line 112 being at a low potential. If all of the data input signals on lines 130, 132, 134, 136 are at a zero potential, the zero line 112 is at a high, indicating that the memory elements are all in the zero state.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A memory system having a global reset capability, comprising:

(MEMORY ARRAY) a memory array having an array of memory cells arranged in rows and columns;

(TAG COLUMN) tag bit storage means, having one tag-memory cell associated with each row of memory cells, each of said tag-memory cells having a zero state, which is indicative of all of the data information stored in the memory cells of an associated row actually being in the zero state or which is alternatively indicative of all of the data information being stored in the memory cells of an associated row being treated as being in the zero state, each of said tag-memory cells having a one state, which is indicative that at least one of the memory cells of an associated row contains data information in a non-zero state;

(INPUT DATA ZERO DETECT LOGIC) detection means for detecting that input data signals to a row of memory cells are all zeroes, said detection means including means for providing an output signal indicative of all zero input to said row of memory cells;

(RESET LINE) means for resetting a tag-memory cell to a zero state to indicate that the data information stored in the associated row is actually or is to be treated as containing all zeros, independent of the actual state of the data information being stored in the associated row of memory cells, thereby providing a global reset function for the entire array of memory cells without having to individually reset the data information stored in the array of memory cells.

2. The memory system of claim 1 including means for forcing the data output signals corresponding to the contents of a row of the memory array to zero states when the tag-memory cell associated with the row is at a zero state.

3. (TAG ZERO DETECTION MEANS) The memory system of claim 2 including detection means for detecting that the tag-memory cells for the entire array of memory cells are each at a zero state and including means for indicating that all of the memory cells in all of the rows of the array are in the zero state, thereby providing a global zero-detection capability for said memory system without having to examine the contents of each cell of said array of memory cells.

4. (BIDIRECTIONAL I/O DRIVER) The memory system of claim 1 including bidirectional driver means, connected to the information output of the memory array, for sending and receiving data information to and from the memory array.

* * * * *